United States Patent
Choi et al.

(10) Patent No.: US 11,233,248 B2
(45) Date of Patent: Jan. 25, 2022

(54) COATING METHOD OF SEPARATOR FOR FUEL CELL AND SEPARATOR FOR FUEL CELL

(71) Applicants: HYUNDAI MOTOR COMPANY, Seoul (KR); KIA MOTORS CORPORATION, Seoul (KR)

(72) Inventors: Kwang Hoon Choi, Yongin-si (KR); Woong Pyo Hong, Seoul (KR); Chi Seung Lee, Yongin-si (KR); Hyun Dal Park, Suwon-si (KR); Bokyung Kim, Yongin-si (KR); Jungyeon Park, Yongin-si (KR); In Woong Lyo, Suwon-si (KR); Jiyoun Seo, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 500 days.

(21) Appl. No.: 16/012,156

(22) Filed: Jun. 19, 2018

(65) Prior Publication Data
US 2018/0301716 A1    Oct. 18, 2018

Related U.S. Application Data

(62) Division of application No. 14/853,638, filed on Sep. 14, 2015, now abandoned.

(30) Foreign Application Priority Data

Feb. 23, 2015    (KR) .................... 10-2015-0025293

(51) Int. Cl.
*H01M 8/0228* (2016.01)
*C23C 16/26* (2006.01)
(Continued)

(52) U.S. Cl.
CPC .......... *H01M 8/0228* (2013.01); *C23C 16/26* (2013.01); *C23C 16/34* (2013.01);
(Continued)

(58) Field of Classification Search
CPC ... H01M 8/02–0223; C23C 16/26–279; C23C 16/30–303; C23C 16/34;
(Continued)

(56) References Cited

U.S. PATENT DOCUMENTS 5,607,722 A * 3/1997 Vaartstra ................. C23C 16/34
427/248.1
2003/0190515 A1    10/2003 Brady et al.
(Continued)

FOREIGN PATENT DOCUMENTS

CN    101901913 A    12/2010
CN    103221586 A    7/2013
(Continued)

OTHER PUBLICATIONS

Machine Translation Kim et al. (KR 10-2008-0105367). (Year: 2008).*
(Continued)

*Primary Examiner* — Jonathan Crepeau
*Assistant Examiner* — Jacob Buchanan
(74) *Attorney, Agent, or Firm* — Lempia Summerfield Katz LLC

(57) ABSTRACT

The method for coating a separator for a fuel cell according to one form of the present disclosure includes the steps of: vaporizing a metal nitride precursor to obtain a precursor gas; introducing a metal nitride coating layer-forming gas containing the precursor gas and a reactive gas to a reaction chamber; applying a voltage to the reaction chamber so that the precursor gas and reactive gas may be converted into a plasma state, thereby forming a metal nitride coating layer
(Continued)

on a substrate; introducing a carbon layer-forming gas containing a carbonaceous gas to the reaction chamber; and applying a voltage to the reaction chamber so that the carbonaceous gas may be converted into a plasma state, thereby forming a carbon coating layer on the metal nitride coating layer.

13 Claims, 3 Drawing Sheets

(51) Int. Cl.
*C23C 16/34* (2006.01)
*C23C 16/455* (2006.01)
*C23C 16/50* (2006.01)
*C23C 28/04* (2006.01)
*H01M 8/0206* (2016.01)
*C23C 28/00* (2006.01)
*H01M 8/0215* (2016.01)

(52) U.S. Cl.
CPC ........ *C23C 16/45523* (2013.01); *C23C 16/50* (2013.01); *C23C 28/04* (2013.01); *C23C 28/042* (2013.01); *C23C 28/42* (2013.01); *H01M 8/0206* (2013.01); *H01M 8/0215* (2013.01); *H01M 2250/20* (2013.01); *Y02T 90/40* (2013.01)

(58) Field of Classification Search
CPC ........... C23C 16/455; C23C 16/45523–45542; C23C 16/50; C23C 28/04; C23C 28/40–42
See application file for complete search history.

(56) References Cited

U.S. PATENT DOCUMENTS

| | | | |
|---|---|---|---|
| 2006/0040165 | A1 | 2/2006 | Uchiyama et al. |
| 2010/0102417 | A1* | 4/2010 | Ganguli ............ C23C 16/45542 257/532 |
| 2011/0065024 | A1* | 3/2011 | Jeon ....................... H01M 8/021 429/514 |
| 2012/0088185 | A1 | 4/2012 | Maeda et al. |
| 2012/0237854 | A1 | 9/2012 | Mikhail et al. |
| 2014/0227631 | A1 | 8/2014 | Jun et al. |

FOREIGN PATENT DOCUMENTS

| | | |
|---|---|---|
| JP | 2008-024996 A | 2/2008 |
| JP | 2009-289707 A | 12/2009 |
| KR | 10-2001-0061823 A | 7/2001 |
| KR | 10-2008-0105367 A | 12/2008 |
| KR | 2014-0094736 A | 7/2014 |

OTHER PUBLICATIONS

Machine Translation of Izumi et al. (JP 2008-024996). (Year: 2008).*
Machine translation of Jun, KR 10-2001-0061823, Jul. 7, 2001.

* cited by examiner

COATING METHOD OF SEPARATOR FOR FUEL CELL AND SEPARATOR FOR FUEL CELL

CROSS-REFERENCE TO RELATED APPLICATIONS

This application is a divisional application of non-provisional U.S. patent application Ser. No. 14/853,638, filed on Sep. 14, 2015, which claims priority to and the benefit of Korean Patent Application No. 10-2015-0025293, filed on Feb. 23, 2015, the entirety of each of which are incorporated herein by reference.

FIELD

The present disclosure relates to a method for coating a separator for a fuel cell, and a separator for a fuel cell.

BACKGROUND

The statements in this section merely provide background information related to the present disclosure and may not constitute prior art.

A fuel cell stack may be divided into repeatedly stacked parts, such as an electrode membrane, a separator, a gas diffusion layer, and a gasket, and non-repeated parts, such as an engaging system required for the engagement of a stack module, an encloser for protecting a stack, a part required for providing an interface with a vehicle, and a high voltage connector. A fuel cell stack is a system in which hydrogen reacts with oxygen in air to emit electricity, water, and heat. In such a fuel cell stack, high-voltage electricity, water, and hydrogen coexist at the same place, and thus it has a large number of dangerous factors.

Particularly, in the case of a fuel cell separator, since positive hydrogen ions generated during the operation of a fuel cell directly contact therewith, an anti-corrosive property is desired. When using a metal separator without surface treatment, metal corrosion occurs and an oxide produced on the metal surface functions as an electrical insulator leading to degradation of electroconductivity. In addition, the positive metal ions dissociated and released at that time contaminate an MEA (Membrane Electrode Assembly), resulting in degradation of the performance of a fuel cell.

In the case of typical carbon-based fuel-cell separators, there is a high risk that cracks generated during its processing may remain in the inner part of a fuel cell, making it difficult to form a thin film in view of its strength and gas permeability, creating problems such as processability.

In the case of a metal separator, while it shows favorable moldability and productivity by virtue of its excellent ductility and allows thin film formation and downsizing of a stack, it may cause contamination of an MEA due to corrosion and an increase in contact resistance due to the formation of an oxide film on the surface thereof, resulting in deterioration of the performance of a stack.

SUMMARY

In one form, the present disclosure provides a method for coating a separator for a fuel cell.

In another form, the present disclosure provides a separator for a fuel cell.

The method for coating a separator for a fuel cell according to one form of the present disclosure includes the steps of: vaporizing a metal nitride precursor to obtain a precursor gas; introducing a metal nitride coating layer-forming gas containing the precursor gas and a reactive gas to a reaction chamber; applying a voltage to the reaction chamber so that the precursor gas and reactive gas may be converted into a plasma state, thereby forming a metal nitride coating layer on a substrate; introducing a carbon layer-forming gas containing a carbonaceous gas to the reaction chamber; and applying a voltage to the reaction chamber so that the carbonaceous gas may be converted into a plasma state, thereby forming a carbon coating layer on the metal nitride coating layer.

The metal nitride precursor may be a titanium nitride, chromium nitride, molybdenum nitride, tungsten nitride, copper nitride, or niobium nitride precursor.

The metal nitride precursor may include a compound represented by the following Chemical Formula 1.

[Chemical Formula 1]

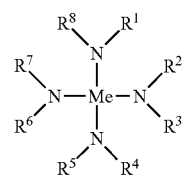

Herein, each of $R^1$ to $R^8$ independently represents a substituted or non-substituted C1 to C10 alkyl group, and Me is Ti, Cr, Mo, W, Cu, or Nb.

In addition, the metal nitride precursor may further include a compound represented by the following Chemical Formula 2, with the proviso that the compound represented by Chemical Formula 1 is different from the compound represented by Chemical Formula 2.

[Chemical Formula 2]

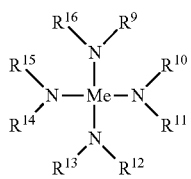

Herein, each of $R^9$ to $R^{16}$ independently represents a substituted or non-substituted C1 to C10 alkyl group, and Me is Ti, Cr, Mo, W, Cu, or Nb.

In Chemical Formulae 1 and 2, each of $R^1$ to $R^{16}$ may represent a methyl group ($CH_3$).

The step of vaporizing a metal nitride precursor to obtain a precursor gas may be carried out at a temperature ranging from 50° C. to 80° C.

The reactive gas may be a nitrogen compound gas or nitrogen gas, and more particularly $NH_3$ or $N_2$.

The carbonaceous gas may be selected from $C_2H_2$, $CH_4$, $C_6H_{12}$, $C_7H_{14}$, or a combination thereof.

The metal nitride coating layer-forming gas may further contain an inert gas and hydrogen gas, and the carbon coating layer-forming gas may further contain an inert gas.

The step of forming a metal nitride coating layer and the step of forming a carbon coating layer may be carried out at a temperature ranging from 100° C. to 200° C.

The step of introducing a metal nitride coating layer-forming gas to a reaction chamber, the step of forming a metal nitride coating layer, the step of introducing a carbon layer-forming gas to the reaction chamber, and the step of forming a carbon coating layer may be repeated many times, and in one form, 5 to 50 times.

The method may further include a step of introducing a reactive gas to the reaction chamber and activating the plasma to carry out nitriding of a topmost layer.

The separator for a fuel cell according to one form of the present disclosure includes a substrate, and a metal coating layer and a carbon coating layer formed on either surface or both surfaces of the substrate.

The metal nitride coating layer may include metal nitride in an amount of 10 at % to 30 at %, and metal oxides and a metal oxynitride in an amount of 0.1 at % to 10 at %.

The metal nitride coating layer may include a metal nitride in an amount of 12 at % to 18 at %, and metal oxides and a metal oxynitride in an amount of 2 at % to 7 at %.

The metal coating layer may include titanium nitride, chromium nitride, molybdenum nitride, tungsten nitride, copper nitride, or niobium nitride.

The metal nitride coating layer may have a thickness of 10 nm to 50 nm.

The carbon coating layer may include carbon with an SP2 structure and carbon with an SP3 structure, and may particularly include carbon with an SP2 structure in an amount of 1.5 to 5 times that of carbon with an SP3 structure on a weight basis.

The carbon coating layer may have a thickness of 1 nm to 15 nm.

The separator for a fuel cell may have a carbon coating layer as a topmost layer, and the topmost layer may be nitrided.

The metal coating layer and carbon coating layer may be alternately formed with each other many times.

The total thickness of the metal coating layers and carbon coating layers alternately formed with each other many times may be 0.1 μm to 10 μm, and the metal coating layers and carbon coating layers may be alternately formed with each other 5 to 50 times in one form of the present disclosure.

According to another form of the present disclosure, it is possible to form a coating layer at a low temperature, thereby reducing deformation of a substrate and thereby reducing production cost.

According to another form of the present disclosure, it is possible to form a coating layer through a PECVD (Plasma Enhanced Chemical Vapor Deposition) process, and thus to form a coating layer even in the case of a large area and mass production.

According to another form of the present disclosure, it is possible to form coating layers having a high connection property between a metal nitride coating layer and a carbonaceous coating layer alternately formed with each other, and having an anti-corrosive property and conductivity.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
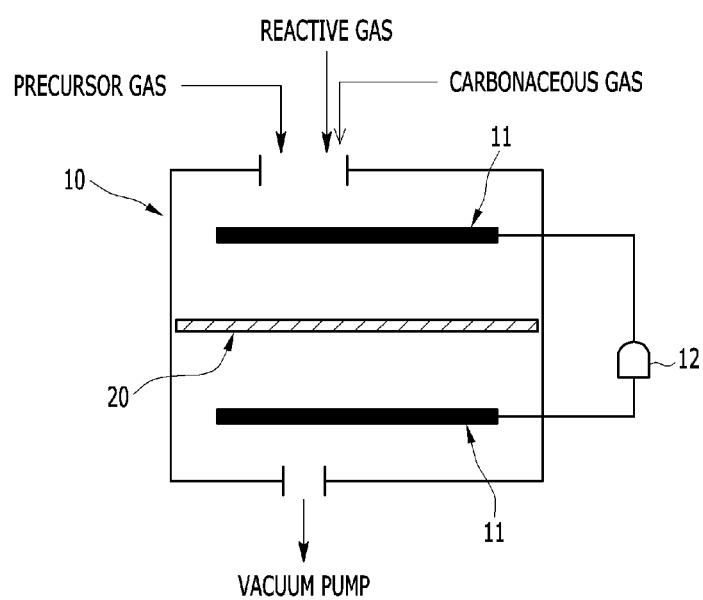
FIG. 1 is a schematic view illustrating a PECVD (Plasma Enhanced CVD) system for forming a coating layer on a separator for a fuel cell according to an exemplary form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

As used herein, unless otherwise defined, "substituted" refers to a group substituted with a C1 to C30 alkyl group; a C1 to C10 alkylsilyl group; a C3 to C30 cycloalkyl group; a C6 to C30 aryl group; a C2 to C30 heteroaryl group; a C1 to C10 alkoxy group; a fluoro group; a C1 to C10 trifluoroalkyl group such as trifluoromethyl group; or a cyano group.

As used herein, unless otherwise defined, "combination thereof" means two or more substituents bound to each other via a linking group, or two or more substituents bound to each other by condensation.

As used herein, unless otherwise defined, "alky group" includes "saturated alkyl group" having no alkene or alkyne group; or "unsaturated alkyl group" having at least one alkene or alkyne group. The "alkene group" means a substituent having at least two carbon atoms bound to each other via at least one carbon-carbon double bond, and "alkyne group" means a substituent having at least two carbon atoms bound to each other via at least one carbon-carbon triple bond. The alkyl group may be branched, linear, or cyclic.

The alkyl group may be a C1 to C20 alkyl group, more particularly a C1 to C6 lower alkyl group, a C7 to C10 medium alkyl group, or a C11 to C20 higher alkyl group.

For example, a C1 to C4 alkyl group means an alkyl group having 1 to 4 carbon atoms in its alkyl chain, and is selected from the group consisting of methyl, ethyl, propyl, isopropyl, n-butyl, isobutyl, sec-butyl, and tert-butyl.

Typical alkyl groups include methyl, ethyl, propyl, isopropyl, butyl, isobutyl, tert-butyl, pentyl, hexyl, ethenyl, propenyl, butenyl, cyclopropyl, cyclobutyl, cyclopentyl, cyclohexyl, or the like.

Referring to FIG. 1, the PECVD system used in an exemplary form of the present disclosure is maintained under vacuum, and includes a reaction chamber 10 in which plasma can be formed, and a gas supply device for alternately supplying a metal nitride coating layer-forming gas containing a reactive gas and a precursor gas with a carbon based coating layer-forming gas containing a carbonaceous gas to the reaction chamber.

In addition, the reaction chamber 10 is connected to a vacuum pump for forming a vacuum in the chamber, and has a substrate (separator) 20 between electrodes 11 disposed in the reaction chamber 10. When power is supplied from a power supply device 12, the gases in the reaction chamber are converted into a plasma state. The gases present in a plasma state undergo polymerization on the surface of the substrate 20, thereby forming a coating layer.

The method for coating a separator for a fuel cell according to an exemplary form of the present disclosure may include the steps of: vaporizing a metal nitride precursor to obtain a precursor gas; introducing a metal nitride coating layer-forming gas containing the precursor gas and a reactive gas to a reaction chamber 10; applying a voltage to the reaction chamber 10 so that the precursor gas and reactive gas may be converted into a plasma state, thereby forming a metal nitride coating layer on a substrate 20; introducing a carbon layer-forming gas containing a carbonaceous gas to the reaction chamber 10; and applying a voltage to the reaction chamber so that the carbonaceous gas may be converted into a plasma state, thereby forming a carbon coating layer on the metal nitride coating layer on the substrate 20.

First, a metal nitride (MeN) precursor is vaporized to obtain a precursor gas. The metal nitride precursor may be a titanium nitride, chromium nitride, molybdenum nitride, tungsten nitride, copper nitride, or niobium nitride precursor. Particularly, the metal nitride precursor may include a compound represented by the following Chemical Formula 1.

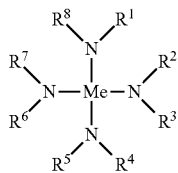

[Chemical Formula 1]

Herein, each of $R^1$ to $R^8$ independently represents a substituted or non-substituted C1 to C10 alkyl group, and Me is Ti, Cr, Mo, W, Cu, or Nb.

In addition, the metal nitride precursor may further include a compound represented by the following Chemical Formula 2, with the proviso that the compound represented by Chemical Formula 1 is different from the compound represented by Chemical Formula 2.

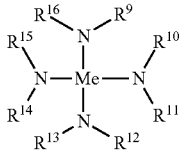

[Chemical Formula 2]

Herein, each of $R^9$ to $R^{16}$ independently represents a substituted or non-substituted C1 to C10 alkyl group, and Me is Ti, Cr, Mo, W, Cu, or Nb.

Each of $R^1$ to $R^{16}$ may represent methyl ($CH_3$).

The metal precursor may be vaporized at 50° C. to 80° C. When the temperature is excessively low, vaporization cannot be carried out smoothly. On the other hand, when the temperature is excessively high, the metal precursor may be degraded to cause a variation in the characteristics of the precursor itself so that its desired characteristics may not be realized and problems such as dust generation may occur. The metal precursor undergoes preliminary decomposition of ligands simultaneously with vaporization.

Next, a metal nitride coating layer-forming gas containing the precursor gas and a reactive gas is introduced to the reaction chamber. Herein, the precursor gas may be introduced through a pressure difference in the chamber by maintaining the pressure inside the reaction chamber at 0.1 to 10 Torr, while the reactive gas may be introduced at 20 sccm to 200 sccm.

The reactive gas may be any gas that reacts with the precursor gas to form a metal nitride layer. For example, the reactive gas may be a nitrogen compound gas or nitrogen gas. More particularly, the reactive gas may be $NH_3$ or $N_2$.

The metal nitride coating layer-forming gas may further include an inert gas and hydrogen gas. The inert gas may be Ar. The inert gas and hydrogen gas function to activate the plasma in the reaction chamber. The inert gas may be introduced at 100 sccm to 500 sccm, and the hydrogen gas may be introduced at 500 sccm to 1500 sccm.

Then, a voltage is supplied from a power supply device to electrodes disposed in the reaction chamber so that the precursor gas and reactive gas may be converted into a plasma state, thereby forming a metal nitride coating layer on the substrate.

A voltage of 400 V to 800 V may be applied. In addition, the reaction chamber may be controlled to a temperature of 100° C. to 200° C. When the temperature is excessively low, the vaporized precursor may be condensed or the decomposition of the precursor may be incomplete, resulting in the problem of an increase in contact resistance. When the temperature is excessively high, the substrate may be deformed. Therefore, the temperature may be controlled within the above-defined range. The metal nitride coating layer may be formed in 2 min to 2 h. In the case of a precursor, the initial gas generated after heating is not used to improve the reliability, and thus the deposition of a coating layer is carried out after the passage of at least 1 h. Then, deposition is carried out for at least 2 min for the purpose of stable activation of plasma. In this manner, it is possible to form a stable coating layer. In the case of a coating layer, it realizes its characteristics in proportion to thickness rather than time, and the coating thickness varies with an increase in processing time. However, the coating layer realizes the same characteristics at a specific thickness after deposition, and thus there is little need for depositing a coating layer beyond such specific thickness.

The thickness of a metal nitride coating layer can be controlled to a desired range by adjusting the conditions including the flow rate of metal nitride coating layer-forming gas, applied voltage, temperature, and time. Particularly, the thickness of metal nitride coating layer may be 10 nm to 50 nm.

Then, a carbon layer-forming gas containing a carbonaceous gas is introduced to the reaction chamber. Herein, the carbonaceous gas may be introduced at a flow rate of 10 sccm to 100 sccm.

There is no particular limitation in the carbonaceous gas contained in the carbon coating layer-forming gas, as long as it can be decomposed by plasma to form a carbon coating layer. Particularly, the carbonaceous gas may be selected from $C_2H_2$, $CH_4$, $C_6H_{12}$, $C_7H_{14}$, and a combination thereof.

The carbon layer-forming gas may further contain an inert gas. The inert gas may be Ar. The inert gas may be introduced at 10 sccm to 200 sccm. In order to prevent deterioration of conductivity due to the formation of an SP3 structure, the carbon layer-forming gas may include no hydrogen gas.

Then, a voltage is supplied from a voltage supply device to electrodes disposed in the reaction chamber so that the precursor gas and reactive gas may be converted into a plasma state, thereby forming a carbon coating layer on the metal nitride coating layer on the substrate.

A voltage of 400 V to 800 V may be applied. In addition, the reaction chamber may be controlled to a temperature of 100° C. to 200° C. When the temperature is excessively low, the decomposition of carbonaceous gas may be incomplete, resulting in the problem of an increase in contact resistance. When the temperature is excessively high, the substrate may be deformed. Therefore, the temperature may be controlled within the above-defined range.

The thickness of the carbon coating layer may be controlled to a desired range by adjusting the conditions including the flow rate of carbon coating layer-forming gas, applied voltage, temperature, and time. Particularly, the carbon coating layer coating layer may have a thickness of 1 nm to 15 nm.

In an exemplary form of the present disclosure, the step of introducing a metal nitride coating layer-forming gas to a reaction chamber; the step of forming a metal nitride coating layer; the step of introducing a carbon layer-forming gas to the reaction chamber; and the step of forming a carbon coating layer may be repeated many times. In this manner, it is possible to repeatedly carry out coating of a metal nitride coating layer alternately with a carbon coating layer many times. It is possible to improve the anti-corrosive property and conductivity by alternately and repeatedly coating a metal nitride coating layer with a carbon coating layer many times.

For example, the number of repetitions may be 5 to 50. When the number of repetitions is excessively small, it is difficult to sufficiently improve the anti-corrosive property. Even when the number of repetitions continuously increases, improvement of the anti-corrosive property is limited, and thus the number of repetitions may be controlled to an adequate number. More particularly, the number of repetitions may be 7 to 45.

The total thickness of the metal nitride coating layers formed alternately with the carbon coating layers many times may be 0.1 μm to 10 μm. The topmost layer may be a chemically stable carbon coating layer in order to prevent oxidation caused by a dangling bond.

The method may further include a step of introducing a reactive gas to the reaction chamber and activating plasma to carry out nitriding of the topmost layer. When the method further includes the above step, the surface may be nitrided and any instable phase may be stabilized.

The separator for a fuel cell according to another form of the present disclosure includes a substrate 20, and a metal nitride coating layer 30 and a carbon coating layer 40 formed on either surface or both surfaces of the substrate.

Figure 2:
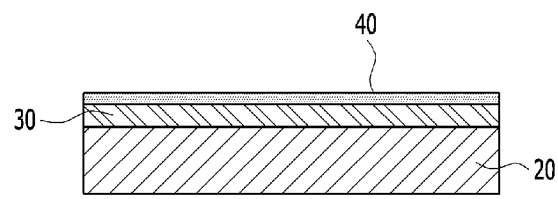
FIG. 2 is a schematic view illustrating the constitution of a separator for a fuel cell according to an exemplary form of the present disclosure.

Referring now to FIG. 2, a form of the present disclosure in which the metal nitride coating layer 30 and the carbon coating layer 40 are successively formed on one surface of the substrate 20 is illustrated.

The metal nitride coating layer may include titanium nitride, chromium nitride, molybdenum nitride, tungsten nitride, copper nitride, or niobium nitride. The metal nitride coating layer improves conductivity in a separator for a fuel cell.

The metal nitride coating layer includes not only metal nitride (MeN) but also metal oxides (MeO, $MeO_2$), metal oxynitride (MeON), etc., due to a surface dangling bond formed in a post-processing step. When such metal oxides (MeO, $MeO_2$) and metal oxynitride (MeON) are present in a large amount, deterioration of electroconductivity may occur. The metal nitride coating layer may contain the metal nitride in an amount of 10 at % to 30 at %, and metal oxides and metal oxynitride in an amount of 0.1 at % to 10 at %. The chamber is maintained in a vacuum state to suppress surface oxidation, and a robot is used to allow a sample to move in the chamber. More particularly, the metal nitride coating layer may contain the metal nitride in an amount of 12 at % to 18 at %, and metal oxides and metal oxynitride in an amount of 2 at % to 7 at %.

The metal nitride coating layer may have a thickness of 10 nm to 50 nm. When the thickness is excessively small, it is difficult to sufficiently improve the anti-corrosive property. When the thickness is excessively large, contact resistance may increase, resulting in deterioration of conductivity. Therefore, the thickness of the metal nitride coating layer may be adequately controlled. Particularly, the metal nitride coating layer may have a thickness of 20 nm to 30 nm.

The carbon coating layer may include carbon with an SP2 structure and carbon with an SP3 structure. The SP2 structure has one carbon atom bound to three surrounding carbon atoms present on the same plane, and the SP3 structure has one carbon atom bound to four adjacent carbon atoms. Since carbon atoms with an SP3 structure are present in a large amount, deterioration of conductivity may occur, so the carbon coating layer may include carbon atoms with an SP2 structure in a larger amount as compared to carbon atoms with an SP3 structure. Particularly, carbon atoms with an SP2 structure may be present in an amount of 1.5 to 5 times the amount of carbon atoms with an SP3 structure on a weight basis.

The carbon coating layer may have a thickness of 1 nm to 15 nm. When the thickness is excessively small, it is difficult to sufficiently improve the anti-corrosive property. Therefore, the thickness of the carbon coating layer may be adequately controlled. Particularly, the carbon coating layer may have a thickness of 5 nm to 10 nm.

The separator for a fuel cell has a carbon coating layer as the topmost layer to prevent oxidation caused by a dangling bond. When a carbon coating layer is the topmost layer, it is possible to further improve the anti-corrosive property since a carbon coating layer is chemically stable.

In addition, nitriding of the topmost layer and stabilization of any instable phase present on the topmost layer may further improve the anti-corrosive property.

Figure 3:
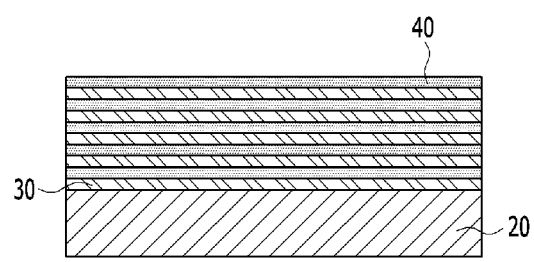
FIG. 3 is a schematic view illustrating the constitution of a separator for a fuel cell according to an exemplary form of the present disclosure.

The metal nitride coating layer and the carbon coating layer may be alternately formed with each other many times. FIG. 3 illustrates one form of the present disclosure in which metal nitride coating layers 30 and carbon coating layers 40 are alternately formed with each other five times.

Particularly, the number of repetitions may be 5 to 50. When the number of repetitions is excessively small, it is difficult to sufficiently improve the anti-corrosive property. Even when the number of repetitions continuously increases, improvement of the anti-corrosive property is limited, and thus the number of repetitions may be controlled to an adequate number. More particularly, the number of repetitions may be 7 to 45.

The total thickness of the metal nitride coating layers alternately formed with the carbon coating layers many times may be 0.1 μm to 10 μm. When the total thickness is excessively small, it is difficult to sufficiently improve the anti-corrosive property and conductivity. Even when the total thickness increases continuously, improvement of anti-corrosive property and conductivity is limited, and thus the total thickness may be controlled to an adequate thickness.

The separator for a fuel cell according to an exemplary form of the present disclosure has an anti-corrosive property and conductivity, and thus may be advantageously used in a fuel cell.

Hereinafter, the present disclosure will be explained in detail with reference to exemplary forms. However, the following exemplary forms are for illustrative purposes only, and the scope of the present disclosure is not limited thereto.

Exemplary Form 1

A precursor including a compound represented by the following Chemical Formula 3 was heated and vaporized at 65° C. to obtain a precursor gas.

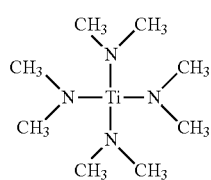

[Chemical Formula 3]

As a substrate, stainless steel (e.g., SUS316L) having a thickness of 0.1 nm was prepared. The substrate was subjected to washing with ultrasonic waves using ethanol and acetone to remove foreign materials on the substrate surface, and then treated with 5% DHF for 5 min to remove a surface oxide film ($Cr_2O_3$).

Then, the precursor gas, $NH_3$ at 100 sccm and Ar at 200 sccm, were introduced into a reaction chamber. At that time, the internal pressure of the reaction chamber was maintained at 0.8 Torr.

Then, a voltage of 600 V was applied to the reaction chamber so that the gases could be converted into a plasma state, and deposition was carried out on the substrate to form a titanium nitride (TiN) coating layer with a thickness of 20 nm.

Then, $CH_4$ at 100 sccm and Ar at 100 sccm were introduced into the reaction chamber.

A voltage of 1500 W was then applied so that the gases could be converted into a plasma state, and deposition was carried out on the titanium nitride coating layer to form a carbon layer with a thickness of 10 nm, thereby providing a separator for a fuel cell.

After measuring by EDAX, XPS, and AES, in the titanium nitride coating layer, the amount of titanium nitride was 11.2 at %, and the sum of titanium oxides (TiO, $TiO_2$) and titanium oxynitride (TiON) was 6.7 at % based on the total atomic weight of titanium.

Exemplary Form 2

The thickness of the carbon coating layer was adjusted to 5 nm. The other processes were the same as in Exemplary Form 1.

Exemplary Form 3

The thickness of the carbon coating layer was adjusted to 15 nm. The other processes were the same as in Exemplary Form 1.

Exemplary Form 4

The thickness of the carbon coating layer was adjusted to 20 nm. The other processes were the same as in Exemplary Form 1.

Exemplary Form 5

The thickness of the carbon coating layer was adjusted to 30 nm. The other processes were the same as in Exemplary Form 1.

Comparative Example 1

No carbon coating layer was deposited. The other processes were the same as in Exemplary Form 1.

Comparative Example 2

The titanium nitride coating layer was deposited to a thickness of 10 nm. The other processes were the same as in Comparative Example 1.

Comparative Example 3

The titanium nitride coating layer was deposited to a thickness of 30 nm. The other processes were the same as in Comparative Example 1.

Experimental Example 1: Measurement of Corrosion Current

The separator for a fuel cell obtained from each of the above exemplary forms was evaluated to determine its corrosion current by using a potentiodynamic polarization test.

First, a corrosive solution containing 10.78 g of sulfuric acid, 35 µl of hydrofluoric acid, and 2 l of ultrapure water was prepared. The separator for a fuel cell obtained from each of Exemplary Form 1 to Exemplary Form 5 and Comparative Example 1 to Comparative Example 3 was provided in the form of a sample having a diameter of 16 mm and immersed in the corrosive solution. The corrosive solution was heated at 80° C. for 30 min and cooled, and then heated again at 80° C. for 30 min. A voltage ranging from 0.4 to 1 V was applied for 25 min and measurement was carried out at a unit interval of 1 mV/s.

Experimental Example 2: Measurement of Contact Resistance

The separator for a fuel cell obtained in each of the above exemplary forms was evaluated to determine its contact resistance by making a connection with a gas diffusion layer (GDL).

One sheet of the separator for a fuel cell obtained from each of the above exemplary forms was interposed between two collectors and pressurized under the application of a pressure of 10 kgf/cm², and then measurement of resistance R1 was carried out. Two sheets of the separator for a fuel cell obtained from each of the above exemplary forms were interposed between two collectors and pressurized under the application of a pressure of 10 kgf/cm², and then measurement of resistance R2 was carried out.

The separator-separator contact resistance is calculated according to the following formula.

Separator-Separator Contact Resistance (mΩ·cm²)= $R2$(mΩ)–$R1$(mΩ)*Separator Area (cm²)

Three sheets of GDL were interposed between two collectors and pressurized under the application of a pressure of 10 kgf/cm², and then measurement of resistance R1 was carried out. Two sheets of GDL-one sheet of the separator for a fuel cell obtained from each of the above exemplary forms-two sheets of GDL were interposed successively between two collectors and pressurized under the application of a pressure of 10 kgf/cm$^2$, and then measurement of resistance R2 was carried out.

The GDL-separator contact resistance is calculated according to the following formula.

GDL-Separator Contact Resistance (mΩ·cm$^2$)=R2 (mΩ)−R1(mΩ)*Separator Area (cm$^2$)

The final contact resistance was calculated by the sum of the separator-separator contact resistance and the GDL-separator contact resistance.

Exemplary Form 6

In the titanium nitride coating layer, the amount of titanium nitride was 1.2 at % and the sum of titanium oxides and titanium oxynitride was 17.7 at % based on the total atomic weight of titanium. The other processes were the same as in Exemplary Form 1.

Measurement of contact resistance was carried out in the same manner as in Experimental Example 2, and the results are shown in the following Table 1.

Exemplary Form 7

In the titanium nitride coating layer, the amount of titanium nitride was 5.7 at % and the sum of titanium oxides and titanium oxynitride was 12.1 at % based on the total atomic weight of titanium. The other processes were the same as in Exemplary Form 1.

Measurement of contact resistance was carried out in the same manner as in Experimental Example 2, and the results are shown in the following Table 1.

Exemplary Form 8

In the titanium nitride coating layer, the amount of titanium nitride was 13.4 at % and the sum of titanium oxides and titanium oxynitride was 3.5 at % based on the total atomic weight of titanium. The other processes were the same as in Exemplary Form 1.

Measurement of contact resistance was carried out in the same manner as in Experimental Example 2, and the results are shown in the following Table 1.

Exemplary Form 9

In the titanium nitride coating layer, the amount of titanium nitride was 17.6 at % and the sum of titanium oxides and titanium oxynitride was 2.8 at % based on the total atomic weight of titanium. The other processes were the same as in Exemplary Form 1.

Measurement of contact resistance was carried out in the same manner as in Experimental Example 2, and the results are shown in the following Table 1.

Exemplary Form 10

In the titanium nitride coating layer, the amount of titanium nitride was 19.1 at % and the sum of titanium oxides and titanium oxynitride was 5.7 at % based on the total atomic weight of titanium. The other processes were the same as in Exemplary Form 1.

Measurement of contact resistance was carried out in the same manner as in Experimental Example 2, and the results are shown in the following Table 1.

TABLE 1

| | Amount of titanium nitride (at %) | Amount of titanium oxides and titanium oxynitride (at %) | Contact resistance (Ω/□) |
|---|---|---|---|
| Exemplary Form 6 | 1.2 | 17.7 | 10720 |
| Exemplary Form 7 | 5.7 | 12.1 | 2004 |
| Exemplary Form 1 | 11.2 | 6.7 | 285.4 |
| Exemplary Form 8 | 13.4 | 3.5 | 105.2 |
| Exemplary Form 9 | 17.6 | 2.8 | 89.1 |
| Exemplary Form 10 | 19.1 | 5.7 | 207.2 |

As can be seen from Table 1, among Exemplary Form 1 and Exemplary Form 6 to Exemplary Form 10, Exemplary Form 1 and Exemplary Form 8 to Exemplary Form 10 show excellent contact resistance.

Exemplary Form 11

The titanium nitride coating layer and carbon coating layer were formed repeatedly twice. The other processes were the same as Exemplary Form 1.

Measurement of corrosion current was carried out in the same manner as in Experimental Example 1, and the results are shown in the following Table 2.

Exemplary Form 12

The titanium nitride coating layer and carbon coating layer were formed repeatedly four times. The other processes were the same as in Exemplary Form 1.

Measurement of corrosion current was carried out in the same manner as in Experimental Example 1, and the results are shown in the following Table 2.

Exemplary Form 13

The titanium nitride coating layer and carbon coating layer were formed repeatedly six times. The other processes were the same as in Exemplary Form 1.

Measurement of corrosion current was carried out in the same manner as in Experimental Example 1, and the results are shown in the following Table 2.

Exemplary Form 14

The titanium nitride coating layer and carbon coating layer were formed repeatedly eight times. The other processes were the same as Exemplary Form 1.

Measurement of corrosion current was carried out in the same manner as in Experimental Example 1, and the results are shown in the following Table 2.

Exemplary Form 15

The titanium nitride coating layer and carbon coating layer were formed repeatedly thirty-three times. The other processes were the same as in Exemplary Form 1.

Measurement of corrosion current was carried out in the same manner as in Experimental Example 1, and the results are shown in the following Table 2.

TABLE 2

| | Number of repetitions | Total thickness of coating layer (nm) | Corrosion current ($\mu A/cm^2$) |
|---|---|---|---|
| Exemplary Form 11 | 2 | 60 | 20.2 |
| Exemplary Form 12 | 4 | 120 | 12.5 |
| Exemplary Form 13 | 6 | 180 | 4.6 |
| Exemplary Form 14 | 8 | 240 | 3.0 |
| Exemplary Form 15 | 33 | 990 | 0.06 |
| Substrate | 0 | 0 | 16.9 |

As can be seen from Table 2, corrosion current decreases as the number of repetitions increases.

The description of this disclosure is merely exemplary in nature and, thus, variations that do not depart from the substance of the disclosure are intended to be within the scope of the disclosure. Such variations are not to be regarded as a departure from the sprit and scope of the disclosure.

What is claimed is:

1. A method for coating a separator for a fuel cell, the method comprising:
   vaporizing a metal nitride precursor to obtain a precursor gas;
   introducing a metal nitride coating layer-forming gas containing the precursor gas and a reactive gas to a reaction chamber;
   applying a voltage to the reaction chamber so that the precursor gas and reactive gas may be converted into a plasma state, thereby forming a metal nitride coating layer on a substrate;
   introducing a carbon layer-forming gas containing a carbonaceous gas to the reaction chamber; and
   applying a voltage to the reaction chamber so that the carbonaceous gas is converted into a plasma state, thereby forming a carbon coating layer on the metal nitride coating layer,
   wherein the step of introducing a metal nitride coating layer-forming gas to a reaction chamber, the step of forming a metal nitride coating layer, the step of introducing a carbon layer-forming gas to the reaction chamber, and the step of forming a carbon coating layer are repeated 5 to 50 times,
   wherein the metal nitride coating layer includes metal nitride in an amount of 10 at % to 30 at %, and
   wherein the carbon coating layer includes carbon with an SP2 structure and carbon with an SP3 structure.

2. The method for coating a separator for a fuel cell of claim 1, wherein the metal nitride precursor is a material selected from the group consisting of titanium nitride, chromium nitride, molybdenum nitride, tungsten nitride, copper nitride, and niobium nitride precursor.

3. The method for coating a separator for a fuel cell of claim 1, wherein the metal nitride precursor comprises a compound represented by the following Chemical Formula 1:

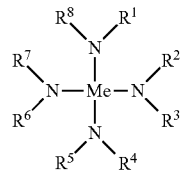

[Chemical Formula 1]

wherein each of $R^1$ to $R^8$ independently represents a substituted or non-substituted C1 to C10 alkyl group, and Me is Ti, Cr, Mo, W, Cu, or Nb.

4. The method for coating a separator for a fuel cell of claim 3, wherein:
the metal nitride precursor further comprises a compound represented by the following Chemical Formula 2

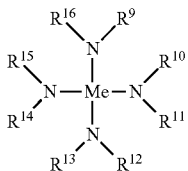

[Chemical Formula 2]

wherein each of $R^9$ to $R^{16}$ independently represents a substituted or non-substituted C1 to C10 alkyl group, and Me is Ti, Cr, Mo, W, Cu, or Nb.

5. The method for coating a separator for a fuel cell of claim 4, wherein each of $R^1$ to $R^{16}$ represents a methyl group ($CH_3$).

6. The method for coating a separator for a fuel cell of claim 1, wherein the step of vaporizing a metal nitride precursor to obtain a precursor gas is carried out at a temperature ranging from 50° C. to 80° C.

7. The method for coating a separator for a fuel cell of claim 1, wherein the reactive gas is one of a nitrogen compound gas and a nitrogen gas.

8. The method for coating a separator for a fuel cell of claim 7, wherein the reactive gas is one of $NH_3$ and $N_2$.

9. The method for coating a separator for a fuel cell of claim 1, wherein the carbonaceous gas is selected from the group consisting of $C_2H_2$, $CH_4$, $C_6H_{12}$, $C_7H_{14}$, and combinations thereof.

10. The method for coating a separator for a fuel cell of claim 1, wherein the metal nitride coating layer-forming gas further comprises an inert gas and hydrogen gas.

11. The method for coating a separator for a fuel cell of claim 1, wherein the carbon coating layer-forming gas further comprises an inert gas.

12. The method for coating a separator for a fuel cell of claim 1, wherein the step of forming a metal nitride coating layer and the step of forming a carbon coating layer are carried out at a temperature ranging from 100° C. to 200° C.

13. The method for coating a separator for a fuel cell of claim 1 further comprising a step of introducing a reactive gas to the reaction chamber and activating the plasma to carry out nitriding of a topmost layer.

* * * * *